United States Patent [19]

Honjoh et al.

[11] Patent Number: 5,132,759
[45] Date of Patent: Jul. 21, 1992

[54] SOLID-STATE IMAGING DEVICE IN WHICH REVERSE BIAS VOLTAGE IS AUTOMATICALLY SET

[75] Inventors: Atsushi Honjoh, Tokyo; Nobuo Suzuki, Yokohama, both of Japan

[73] Assignee: Kabushiki Kaisha Toshiba, Kawasaki, Japan

[21] Appl. No.: 544,869

[22] Filed: Jun. 28, 1990

[30] Foreign Application Priority Data

Jul. 28, 1989 [JP] Japan .................... 1-195947
Nov. 8, 1989 [JP] Japan .................... 1-290574

[51] Int. Cl.⁵ .................... H01L 29/78; H01L 27/14; H01L 31/00
[52] U.S. Cl. .................... 357/24; 357/30; 377/59; 377/60; 377/61; 377/62; 377/63
[58] Field of Search .................... 357/24 LR, 24, 30 H, 357/30 R; 377/59-63

[56] References Cited

U.S. PATENT DOCUMENTS

| | | | |
|---|---|---|---|
| 4,665,325 | 5/1987 | Yamada et al. | 357/24 LR |
| 4,717,945 | 1/1988 | Yusa et al. | 357/24 |
| 4,748,486 | 5/1988 | Miyatake | 357/24 LR |
| 4,851,890 | 7/1989 | Miyatake | 357/24 LR |
| 4,977,584 | 11/1990 | Kohno et al. | 357/24 LR |

FOREIGN PATENT DOCUMENTS

| | | |
|---|---|---|
| 033129 | 8/1981 | European Pat. Off. |
| 55-27653 | 2/1980 | Japan .................... 357/24 LR |

Primary Examiner—Andrew J. James
Assistant Examiner—Ngan Van Ngo
Attorney, Agent, or Firm—Foley & Lardner

[57] ABSTRACT

A solid-state imaging device includes on a semiconductor substrate of a first conductivity type, a well of the opposite conductivity type and, in addition, a plurality of light-sensitive elements formed in the well. A reverse bias voltage applied to the semiconductor substrate with respect to the well causes charge stored in the light-sensitive elements less than or equal to a potential barrier voltage to leak out into the semiconductor substrate. On the substrate a detection circuit detects the resistance of the semiconductor substrate and a setting circuit sets the reverse bias voltage in such a manner as to keep the potential barrier voltage constant, based on the resistance detected by the detection circuit.

4 Claims, 5 Drawing Sheets

SOLID-STATE IMAGING DEVICE IN WHICH REVERSE BIAS VOLTAGE IS AUTOMATICALLY SET

The present invention relates to a solid-state imaging device.

BACKGROUND OF THE INVENTION

1. Description of the Prior Art

The structure of a conventional solid-state imaging device will be described below with reference to the device shown in FIG. 6. Light incident on light-sensitive elements 11 arranged in a two-dimensional array is converted into charge, and a charge equivalent to the quantity of incident light is stored in the light-sensitive elements 11. After the stored charge is read out at a predetermined timing by vertical transfer paths 12, it is sent via the vertical transfer paths 12 and a horizontal transfer path 13 to an output circuit 14, it is converted into a voltage and its current is amplified, then it is output to the outside.

A cross-sectional view of this solid-state imaging device, taken along the line X—X in FIG. 6, is shown in FIG. 7. In FIG. 7, a $p^-$-well region 23 is formed on an n-type semiconductor substrate 24, and a light-sensitive element 11 and a vertical transfer path 12, together with an element isolation region 25, are formed on the $p^-$-well region 23. In addition, a read-out electrode 21 is formed on the $p^-$-well region 23 between the light-sensitive element 11 and the vertical transfer path 12, and a transfer electrode 22 is formed on the vertical transfer path 12. Then a light-proof film 26 that has a hole therein is formed over the electrodes 21 and 22.

Light incident through the hole in the light-proof film 26 is stored in the light-sensitive element 11 as a charge. This stored charge is read out from the vertical transfer path 12 by applying a positive voltage to the read-out electrode 21, then is transferred by a pulse voltage applied to the transfer electrode 22. During this time, a reverse-bias voltage $V_{sub}$ is applied to the semiconductor substrate 24 by a variable-voltage source 15.

In this solid-state imaging device, the depth of the $p^-$-well region 23 directly under the light-sensitive element 11 is reduced to $X_j$, so that any excess charge stored in the light-sensitive element 11 leaks out into the semiconductor substrate 24 via the $p^-$-well region 23. The distribution of potential along the line A-B of FIG. 7 in this case is shown in FIG. 8. Any charge stored in the light-sensitive element 11 that exceeds the $p^-$-well's potential barrier voltage $V_T$ ($V_T$=1V in this example) will leak out into the semiconductor substrate 24. Therefore, if the potential barrier voltage $V_T$ is too large, the maximum amount of charge that can be stored in the light-sensitive element 11 will decrease and the dynamic range of the solid-state imaging device will also decrease. On the other hand, if the potential barrier voltage $V_T$ is too small, excess charge will flow into other light-sensitive elements and the charge transfer paths (the vertical transfer path 12 and horizontal transfer path 13), causing spurious signals. Therefore, the potential barrier voltage $V_T$ must be set to a suitable value. (Problem To Be Solved by the Present Invention)

Even if solid-state imaging devices of the above construction are manufactured by a fixed production process, there will be variations in the resistivity $\rho_{sub}$ of different semiconductor substrates 24. For this reason, it is well-known that a different reverse-bias voltage must be applied to each solid-state imaging device, to set the potential barrier $V_T$ of the P-well region to be a predetermined valve.

This situation will now be explained with reference to FIG. 9. If, for example, the optimum potential barrier voltage $V_T$ is taken to be 1.0V, a reverse-bias voltage $V_{sub}$ of 10.0V must be applied to a solid-state imaging device whose semiconductor Substrate has a resistivity of 35 $\Omega$·cm (see curve $g_2$).

To ensure this potential barrier voltage $V_T$ of 1.0V in solid-state imaging devices whose semiconductor substrates have resistivities of 27 $\Omega$·cm or 43 $\Omega$·cm, corresponding reverse-bias voltage $V_{sub}$ of 5.0V and 15V must be applied, as shown by curves $g_1$ and $g_3$, respectively.

When it comes to manufacturing semiconductor wafers in the high-resistance region, it is generally difficult to control the process to ensure that resistivity is constant, so it is difficult to obtain large numbers of wafers of same resistivity. The conventional remedy is to measure the value of $\rho_{sub}$ of each substrate and adjust the reverse-bias voltage $V_{sub}$ in such a way that the potential barrier voltage $V_T$ is always the same. In the examples shown in FIG. 9, reverse-bias voltages $V_{sub}$ of 5.0V, 10.0V, and 15.0V would have to be applied to the semiconductor substrates whose resistivities $\rho_{sub}$ are 27 $\Omega$·cm, 35 $\Omega$·cm, and 43 $\Omega$·cm, respectively, in order to obtain a constant potential barrier voltage $V_T$(=1.0V).

Therefore, this conventional solid-state imaging device has the problem that the reverse-bias voltage $V_{sub}$ must be adjusted from the outside.

SUMMARY OF THE INVENTION

The present invention is designed to solve the above problems. It provides a solid-state imaging device in which a reverse bias voltage is automatically set in such a manner that a potential barrier voltage is at an optimum level.

The present invention relates to an improvement to a solid-state imaging device that comprises, on a semiconductor substrate of a first conductivity type, a well of the opposite conductivity type and, in addition, a plurality of light-sensitive elements formed in the well, wherein a reverse bias voltage applied to the semiconductor substrate with respect to the well causes such of a charge stored in the light-sensitive elements as is less than or equal to a potential barrier voltage to leak out into the semiconductor substrate. The improvement comprises the provision on the substrate of a detection means that detects the resistance of the semiconductor substrate and a setting means that sets the reverse bias voltage in such a manner as to keep the potential barrier voltage constant, based on the resistance detected by the detection means.

In the solid-state imaging device constructed in the above manner, the resistance of the semiconductor substrate is detected by the detection means, and the reverse bias voltage is set by the setting means in such a way that the potential barrier voltage is kept constant, based on the detected resistance. This operation enables automatic setting of the reverse bias voltage in such a way that the potential barrier voltage is kept at an optimum value, removing the need to adjust the reverse bias voltage from the outside.

BRIEF DESCRIPTION OF THE DRAWINGS

FIG. 10 is a graph of a relationship between the voltage $V_{sub}$, the potential barrier voltage $V_T$, and the reference voltage $V_{ref}$.

DESCRIPTION OF THE PREFERRED EMBODIMENTS

Figure 1:
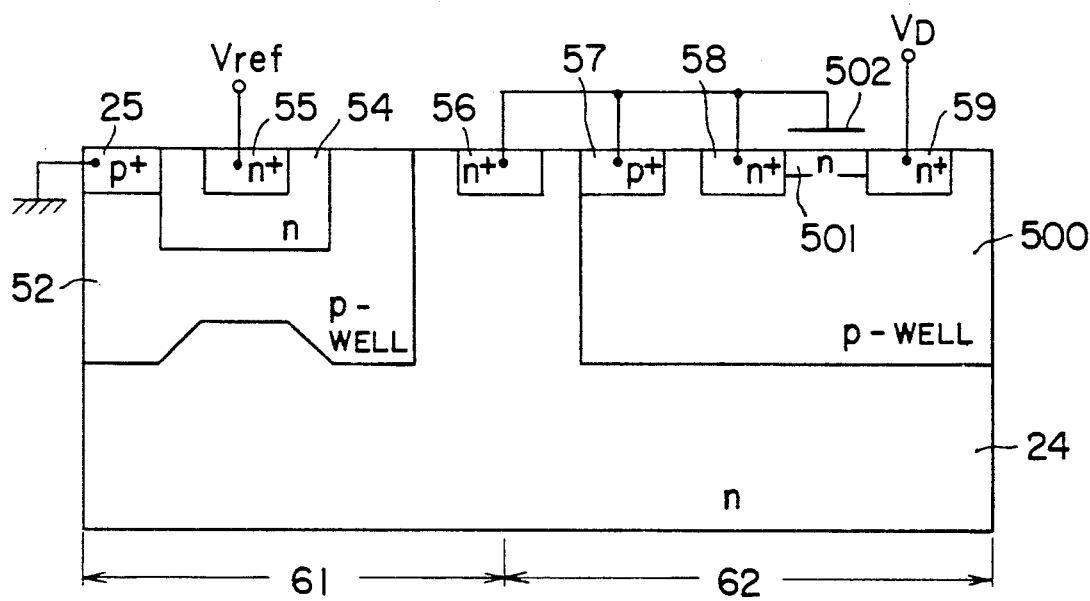
FIG. 1 is a cross-sectional view of a detection circuit and a setting circuit of a solid-state imaging device according to a first embodiment of the present invention.
Figure 2:
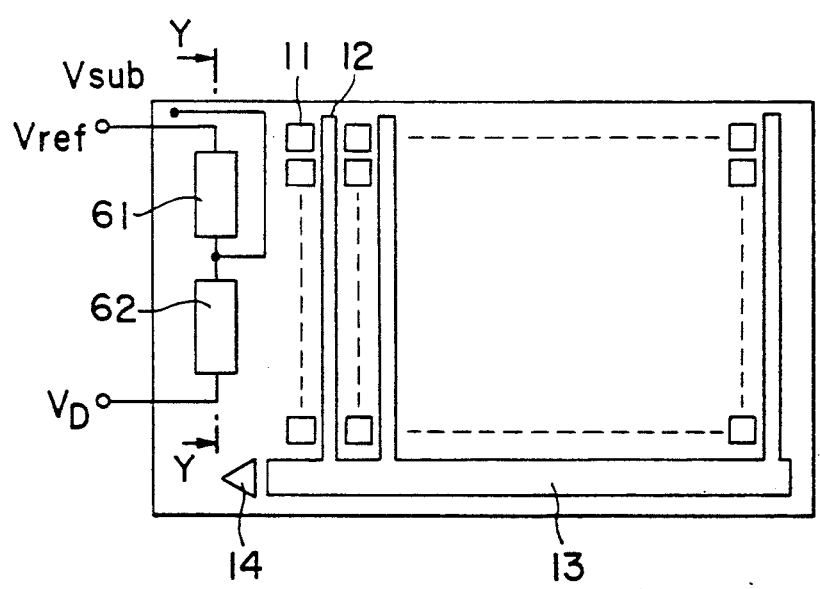
FIG. 2 is a plan view of the solid-state imaging device according to the first embodiment of the present invention.

A first embodiment of the solid-state imaging device of the present invention is shown in FIG. 2. This embodiment of the solid-state imaging device comprises a plurality of light-sensitive elements 11, vertical transfer paths 12, a horizontal transfer path 13, an output circuit 14, a detection circuit 61, and a setting circuit 62. Elements other than the detection circuit 61 and setting circuit 62 have already been described in the section on the prior art, so further description thereof is omitted. The detection circuit 61 and setting circuit 62 are formed on the same semiconductor substrate as the other elements (such as the light-sensitive elements 11). A cross-section through the detection circuit 61 and setting circuit 62, taken along the line Y—Y of FIG. 2, is shown in FIG. 1. The detection circuit 61 is constructed of a p⁻-well region 52 formed on the n-type semiconductor substrate 24, with an n-type diffusion layer 54 formed in the p⁻-well region 52. An n⁺ layer 55 to which a reference voltage $V_{ref}$ is applied is created within the diffusion layer 54, and a p⁺ region 25, acting as an element isolation and connection region, is formed in the p⁻-well region 52.

The setting circuit 62 is constructed of a p⁻-well region 500 formed on the n-type semiconductor substrate 24, with a p⁺ layer 57 used as a contact, a source region 58 comprising an n⁺ layer, a drain region 59 comprising an n⁺ layer, and a channel region 501 comprising an n layer formed in the p⁻-well region 500. A gate electrode 502 comprising aluminum or polysilicon is formed on the channel region 501 with an insulating film therebetween. An n⁺ layer 56 acting as a contact is formed between the p⁻-well regions 52 and 500. The n⁺ layer 56, p⁺ layer 57, n⁺ layer 58, and the gate electrode 502 are connected by the same wiring, and a drain voltage $V_D$ is applied to the drain region 59. Note that the detection circuit 61 and setting circuit 62 are covered with a light-proof film, but this film is not shown in the figure.

The operations of the detection circuit 61 and setting circuit 62 will now be described.

Figure 6:
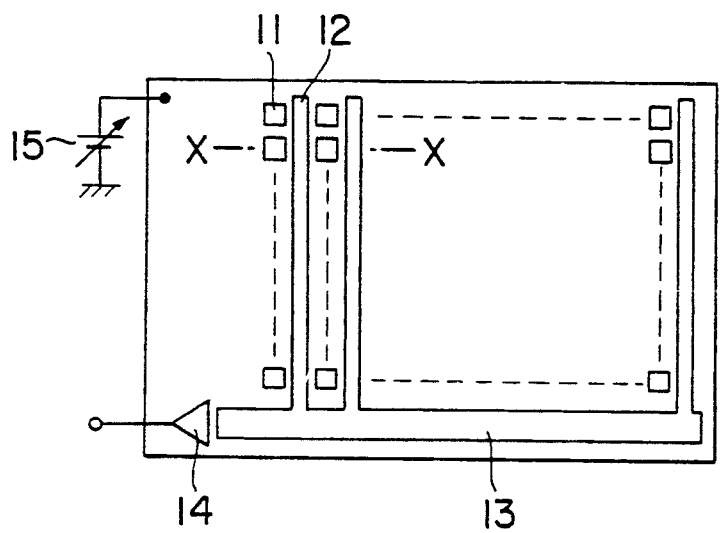
FIG. 6 is a plan view of a conventional solid-state imaging device.
Figure 7:
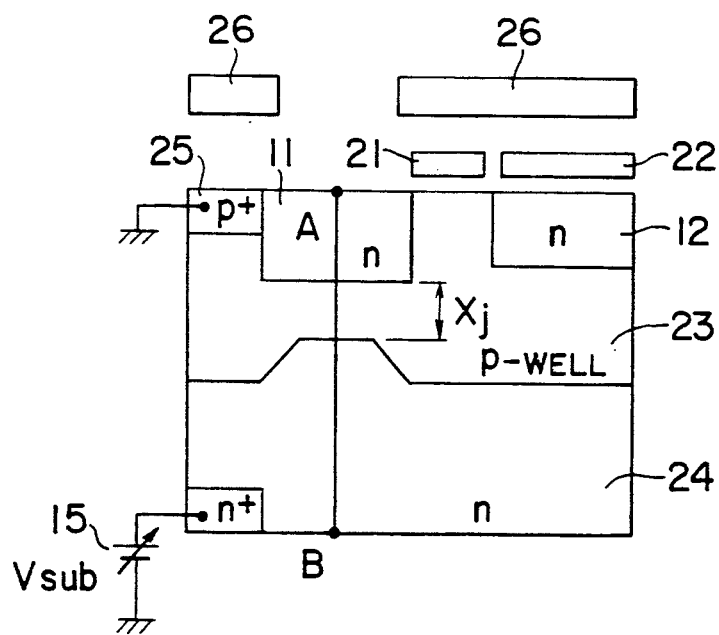
FIG. 7 is a cross-sectional view of the conventional solid-state imaging device of FIG. 5, taken along the line X—X.

As can be seen from FIG. 1, the detection circuit 61 has basically the same structure as the combination of the light-sensitive element 11 and the p⁻-well region 23 thereunder of the conventional solid-state imaging device of FIG. 6, but the n⁺ layer 55 in the n-type diffusion layer 54 corresponding to the light-sensitive element 11 is formed within the detection circuit 61, and the potential of the n-type diffusion layer 54 can be set to the reference voltage $V_{ref}$ by the wiring connected to the n⁺ layer 55. FIG. 10 shows a potential along the line P-Q in FIG. 1. Due to the structural similarity discussed above, the potential shown in FIG. 10 is similar to that of FIG. 8 and the potential at the point P is $V_{ref}$. As can be seen from FIG. 10, the current abruptly begins to flow when the potential $V_{ref}$ becomes lower than the potential barrier voltage $V_T$. Since the potential barrier voltage $V_T$ depends on the resistivity $\rho_{sub}$ of the semiconductor substrate 24, the above description shows that the detection circuit 61 can detect the resistivity $\rho_{sub}$ of the semiconductor substrate 24.

The setting circuit 62 is a constant-current circuit that makes use of the saturation characteristics of the MOS transistor formed of the source region 58, channel region 501, drain region 59, and gate electrode 502. For example, if the threshold voltage $V_T$ of the above MOS transistor is −2V and its drain voltage $V_D$ is 20V, the setting circuit 62 functions as a constant-current source whose current is $kV_T^2/2$, to set the reverse-bias voltage $V_{sub}$ applied to the substrate 24 to within the range of $V_{sub} \leq V_D + V_T = 18$ V. In this case, the characteristic of the setting circuit 62 is as shown by the curve 1 in FIG. 3, where k=0.5 mA/V².

Figure 3:
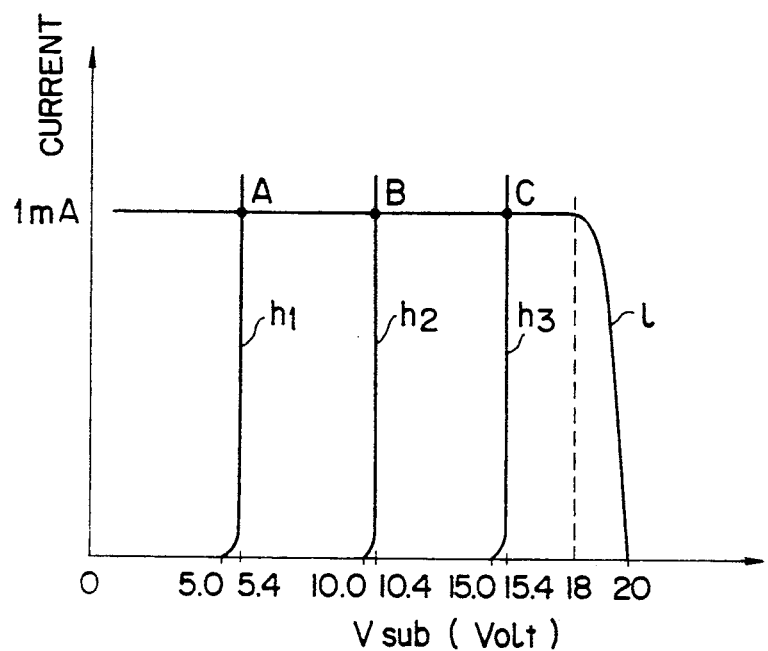
FIG. 3 is a graph of the characteristics of the detection circuit and setting circuit shown in FIG. 1.

Now, if $V_{ref}=1.0V$ is applied to the n⁺ layer 55 of the detection circuit 61, the potential of the n layer 54 becomes 1V. If the reverse-bias voltage $V_{sub}$ applied to the semiconductor substrate 24 rises well above zero, the potential barrier voltage $V_T$ of the p⁻-well region 52 also rises, as can be seen from FIG. 8. If the reverse-bias voltage $V_{sub}$ reaches the level at which this potential barrier voltage $V_T$ becomes 1V (for example, if $V_{sub}$ becomes 5V when the resistivity $\rho_{sub}$ is 27 Ω·cm), electrons start to flow out into the substrate 24 via the p⁻-well region 52. These electron flows are shown in FIG. 3 by curves h₁, h₂, and h₃ which are characteristics curves for the detection circuit 61, expressing the relationship between reverse-bias voltage $V_{sub}$ and current for resistivities $\rho_{sub}$ of 27 Ω·cm, 35 Ω·cm, and 43 Ω·cm, respectively. If the voltage $V_{sub}$ applied to the substrate 24 reaches 10V when the resistivity $\rho_{sub}$ of the substrate is 35 Ω·cm, the potential barrier voltage $V_T$ of the p⁻-well region 52 becomes 1V and a current starts to flow. If $V_{sub}$ becomes 10.4V, the resultant current is 1 mA (curve h₂). Curves h₁ and h₃ are approximately parallel to curve h₂, showing that the current flowing into the substrate 24 is 1 mA when the voltage $V_{sub}$ reaches a value that is 0.4V higher than its value when the potential barrier voltage $V_T$ is 1.0V.

In the solid-state imaging device of this embodiment, the currents flowing in the detection circuit 61 and setting circuit 62 are approximately the same, provided that currents flowing into the substrate 24 from the outside can be ignored.

Figure 8:
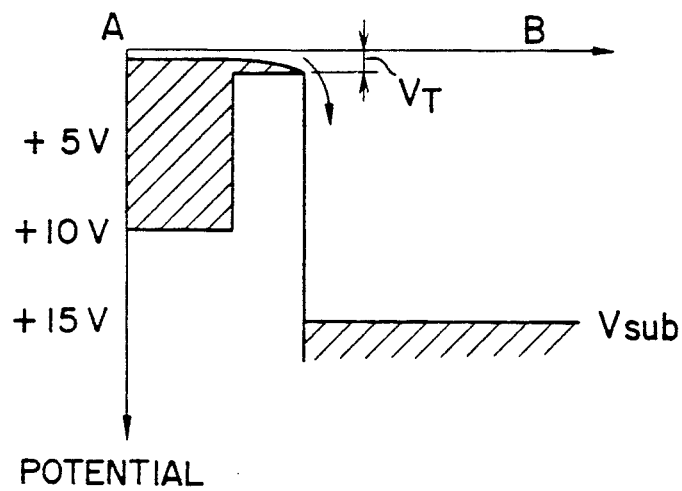
FIG. 8 is a diagram of the potential distribution in the depthwise direction below a light-sensitive element of the conventional solid-state imaging device.
Figure 9:
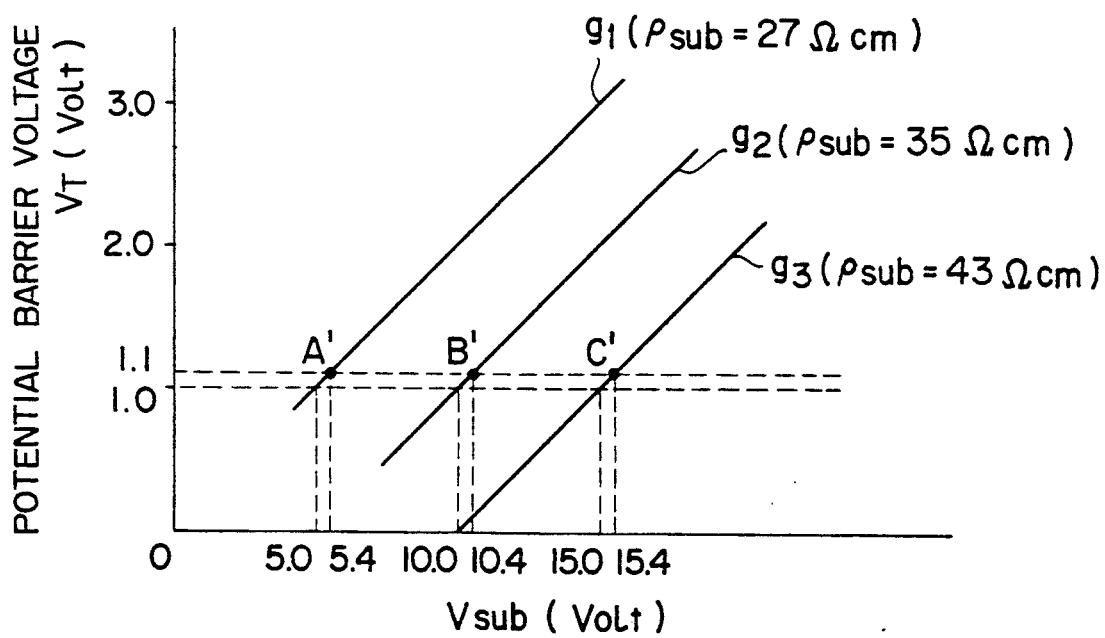
FIG. 9 is a graph of the relationship between a voltage $V_{sub}$ applied to the substrate and the potential barrier voltage $V_T$.

Therefore, points A, B, and C where the curves $h_1$, $h_2$, and $h_3$ intersect the curve 1 are the operating points when the resistivity $\rho_{sub}$ of the substrate is 27 Ω·cm, 35 Ω·m, and 43 Ω·cm, respectively. In other words, when the resistivity $\rho_{sub}$ of the substrate is 27 Ω·cm, 35 Ω·cm, or 43 Ω·cm, the voltage $V_{sub}$ applied to the substrate 24 can be set to 5.4V, 10.4V, or 15.4V, respectively. In all these cases, the potential barrier voltage $V_T$ shown in FIG. 8 can be obtained in the p⁻-well region 52. In FIG. 8, the points A', B', and C' on the curves $g_1$, $g_2$, and $g_3$ corresponding to the above values of resistivity $\rho_{sub}$ indicate the points at which the set voltage $V_{sub}$ is 5.4V, 10.4V, and 15.4V, respectively. The y-coordinate of these points, in other words, the potential barrier voltage $V_T$, is approximately 1.1V. In this case, since the p⁻-well region 23 below the light-sensitive element 11 has the same structure as the p⁻-well region 52, its potential barrier voltage $V_T$ is also approximately 1.1V.

The above description shows that, in this embodiment, the voltage $V_{sub}$ applied to the substrate is automatically set so as to keep constant the potential barrier voltage $V_T$ of the p⁻-well region 23 under the light-sensitive element 11, even if the resistance of the substrate used in the construction of the solid-state imaging device should change. Therefore, there is no need to adjust the voltage $V_{sub}$ from the outside.

Figure 4:
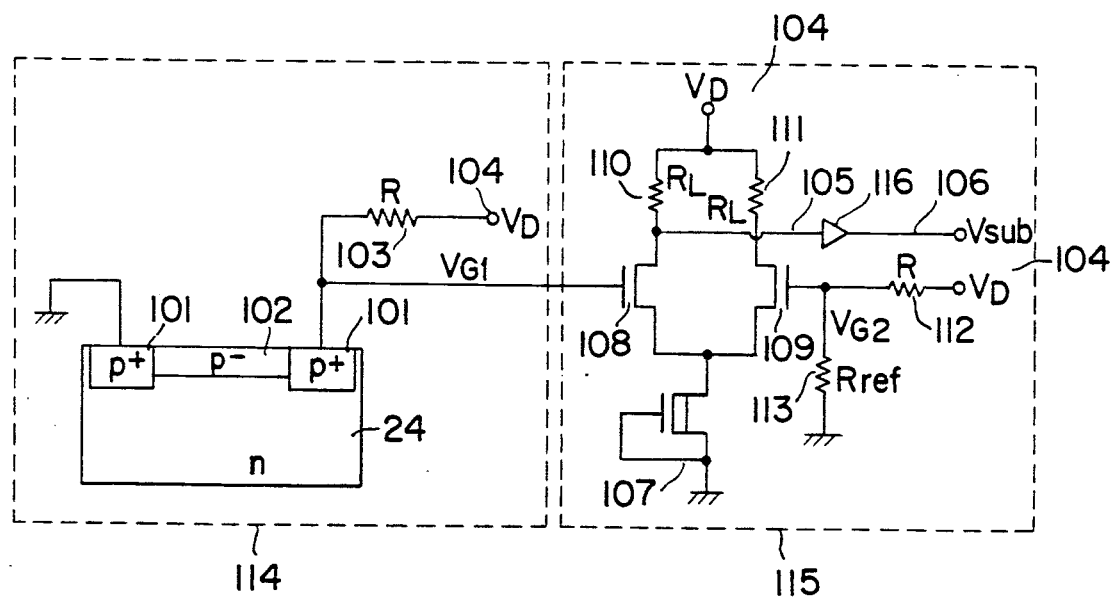
FIG. 4 is a circuit diagram of a detection circuit and a setting circuit of a solid-state imaging device according to a second embodiment of the present invention.

A second embodiment of the present invention will now be described with reference to FIG. 4. The solid-state imaging device of this embodiment is provided with a detection circuit 114 and setting circuit 115 in place of the detection circuit 61 and setting circuit 62 of the first embodiment shown in FIG. 1. The detection circuit 114 and setting circuit 115 are shown in FIG. 4.

The detection circuit 114 detects the resistivity $\rho_{sub}$ of the n-type semiconductor substrate 24, and is constructed as follows. First, a p⁻ layer 102 is formed in the substrate 24 by the implantation of a fixed amount of ions of an acceptor such as boron. Then p⁻ layers 101 are formed on the substrate 24 to provide ohmic contact between the p⁻ layer 102 and wiring. A divided voltage $V_{G1}$ is obtained by dividing the voltage $V_D$ of a power source 104 by a resistor 103 and the p⁻ layer 102.

The setting circuit 115 sets the voltage $V_{sub}$ applied to the substrate 24, and is constructed as follows. The drains of two MOS transistors 108 and 109 are connected by resistors 110 and 111 to the power source 104, and their sources are connected to the drain of a MOS transistor 107 that acts as a constant-current source. The source of the MOS transistor 107 is grounded. The voltage of the power source 104 is divided by resistors 112 and 113, and the voltage divided by the resistor 113 ($V_{G2}$ is applied to the gate of the MOS transistor 109. The voltage $V_{G1}$ obtained by the detection circuit 114 is applied to the gate of the MOS transistor 108. In addition, the drain voltage of the MOS transistor 108 is applied to a current amplifier 116, and the output of this current amplifier 116 becomes the voltage $V_{sub}$ applied to the substrate 24.

The operation of the detection circuit 114 and setting circuit 115 will now be described. Assume that the resistance of the n-type substrate 24 used in the construction of the second embodiment of the solid-state imaging device falls below a reference value, in other words, assume that the substrate 24 has a high donor density. The electrical characteristics of the acceptor used in the formation of the p⁻ layer 102 are negated by the donor of the substrate 24, so the resistance of the p⁻ layer 102 rises This increases the voltage $V_{G1}$, lowering the on resistance of the MOS transistor 108. On the other hand, since the gate voltage of the MOS transistor 109 is set by the resistors 112 and 113 that are not affected by the resistance (i.e., the resistivity $\rho_{sub}$) of the substrate 24, the resistance of the MOS transistor 109 does not change. As a result, more of the current supplied by the constant-current source 107 flows through the MOS transistor 108. This increases the voltage drop across the resistor 110, lowering the voltage input to the current amplifier 116, and lowering the voltage $V_{sub}$ applied to the substrate 24.

If the resistance of the n-type substrate 24 should fall below the reference value, the voltage $V_{sub}$ has to fall in order to keep the potential barrier voltage $V_T$ constant, as can be easily deduced from the graph in FIG. 8. However, this correction can be obtained by suitably setting the operating points and gains of the detection circuit 114 and the setting circuit 115.

As described above, the embodiment of FIG. 4 is able to provide the same result as the first embodiment of the present invention.

Figure 5:
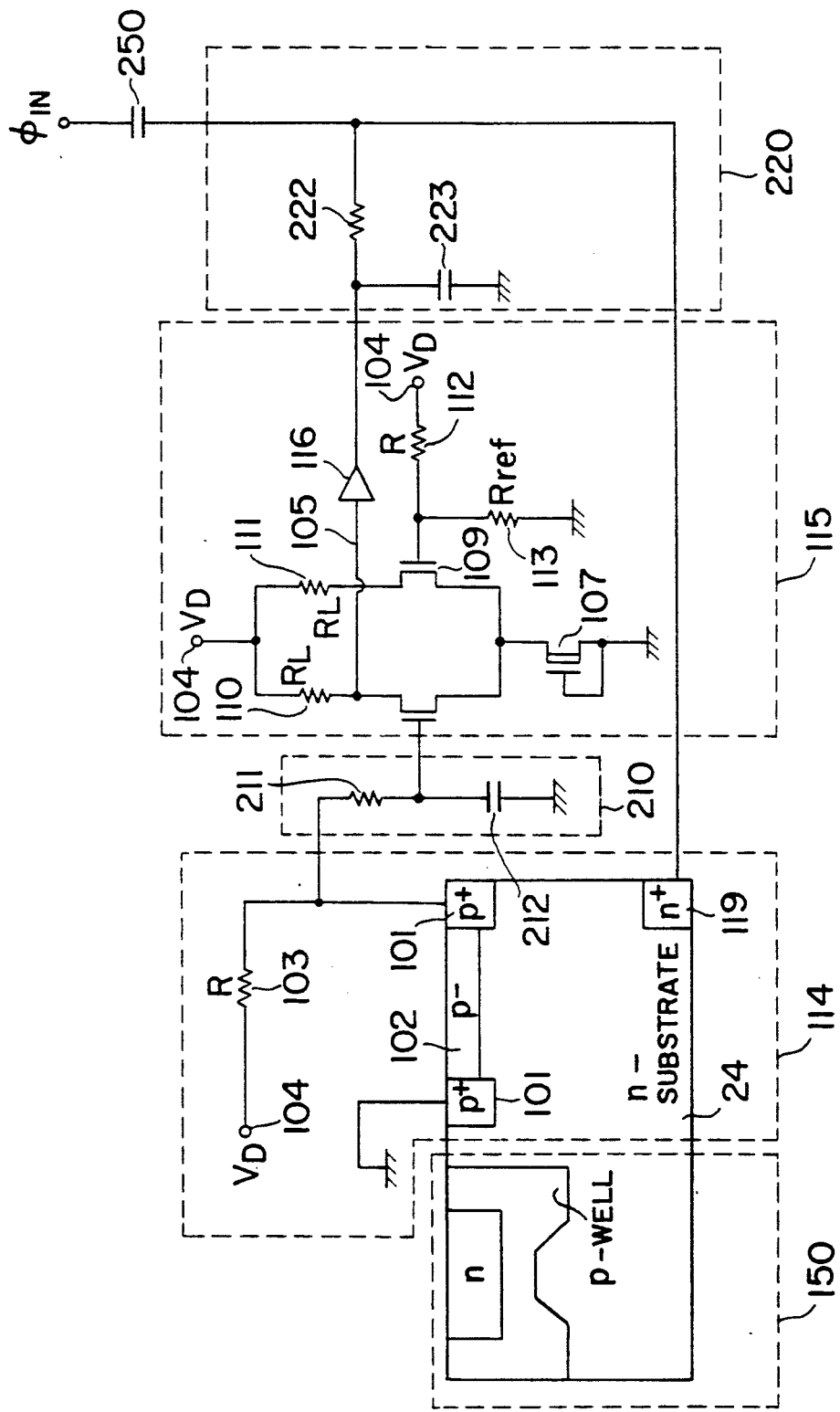
FIG. 5 is a circuit diagram showing a third embodiment of the present invention.

A third embodiment of the present invention is shown in FIG. 5. The solid-state imaging device of this embodiment is provided with a low-pass filter consisting of a resistor 211 and a capacitor 212, and a pulse inputting circuit 220 consisting of a resistor 222 and a capacitor 223, in addition to the circuit shown in FIG. 4.

The pulse inputting circuit applies the sum of the output $V_{sub}$ of the current amplifier 116 in the setting circuit 115 and a pulse voltage $\phi_{IN}$ inputted from an outside circuit (not shown) through a coupling capacitor 250 to the n⁺ region 119 in the substrate 24.

As described above, the embodiment of FIG. 5 is also able to provide the same technical advantage as the second embodiment of the present invention.

The third embodiment shown in FIG. 5 may be modified to apply a pulse voltage to the substrate 24 from the outside circuit (not shown) through the coupling capacitor.

According to the present invention, a voltage $V_{sub}$ applied to the substrate can be automatically set to keep the potential barrier voltage $V_T$ constant, removing the need for adjustment from outside the solid-state imaging device.

What is claimed is:
1. A solid-state imaging device comprising:
   a semiconductor substrate of a first conductivity type on which a well of the opposite conductivity type is formed;
   a setting circuit provided on said semiconductor substrate;
   a plurality of light-sensitive elements formed in said well, wherein electrical charges are stored in said light-sensitive elements, and wherein a reverse bias voltage is applied to said semiconductor substrate with respect to said well by said setting circuit causing said electrical charges, which have lower potential voltages than a potential barrier voltage, to leak out into said semiconductor substrate; and
   a detection circuit, provided on said semiconductor substrate, that detects the resistance of said semiconductor substrate, wherein said setting circuit sets said reverse bias voltage to keep said potential barrier voltage constant, based on said resistance detected by said detection circuit.
2. A solid-state imaging device according to claim 1, wherein said detection circuit is constructed of a layer on said substrate corresponding to a light-receiving element and is connected to a reference voltage source, and said setting circuit is constructed of a constant-current source comprising a MOS transistor formed on said substrate, wherein the source and gate of said MOS transistor are connected to said substrate and a power voltage is applied to the drain thereof.

3. A solid-state imaging device according to claim 1, wherein said detection circuit is provided with a resistive region formed in the surface of said substrate, of the opposite conductivity type to that of said substrate, and a resistance connected directly to said resistivity region; an output electrode is formed at the mutual connection point between said resistivity region and said resistance; another end of said resistivity region is grounded; and a power voltage is applied to another end of said resistance;

and said setting circuit comprises a differential amplifier having a constant-current circuit, wherein an output of said detection circuit is applied to one input of said differential amplifier and a constant voltage is applied to another input thereof, and an output of said differential amplifier is applied to said semiconductor substrate.

4. A solid-state imaging device according to claim 1, wherein:
 a pulse inputting circuit consisting of a resistor and a capacitor is provided in said setting circuit; and
 a low-pass filter consisting of a resistor and a capacitor is provided between said setting circuit and said detection circuit.

* * * * *